United States Patent [19]

Kalnitsky et al.

[11] Patent Number: 5,982,011
[45] Date of Patent: Nov. 9, 1999

[54] PHOTODIODE STRUCTURE AUGMENTED WITH ACTIVE AREA PHOTOSENSITIVE REGIONS

[75] Inventors: Alexander Kalnitsky, San Francisco; Marco Sabatini, Berkeley, both of Calif.

[73] Assignee: STMicroelectronics, Inc., Carrollton, Tex.

[21] Appl. No.: 08/977,468

[22] Filed: Nov. 24, 1997

[51] Int. Cl.$^6$ .................................................... H01L 27/14
[52] U.S. Cl. .......................... 257/435; 257/446; 257/448; 257/457
[58] Field of Search ..................... 257/435, 448, 257/431, 446, 457

[56] References Cited

U.S. PATENT DOCUMENTS 4,717,946   1/1988   Godfrey ................................. 257/448
4,972,243  11/1990   Sugawa et al. ........................ 257/435

*Primary Examiner*—Donald L. Monin, Jr.
*Attorney, Agent, or Firm*—Theodore E. Galanthay; Lisa K. Jorgenson; Peter J. Thoma

[57] ABSTRACT

A photodiode structure augmented with active area photosensitive regions is used for detecting impinging radiation. The photodiode includes a semiconductor base layer doped with impurities of a first carrier type, a field oxide layer disposed upon the base layer with an opening formed therethrough, a plurality of auxiliary oxide layers wherein each is separately disposed upon the base layer, and a semiconductor diffusion layer doped with impurities of a second carrier type arranged upon the base layer and in contact with the oxide layers. When the photodiode is electrically energized, a plurality of integral photosensitive regions is created within the depletion region to facilitate the detection of impinging radiation at an increased quantum efficiency.

20 Claims, 2 Drawing Sheets

PHOTODIODE STRUCTURE AUGMENTED WITH ACTIVE AREA PHOTOSENSITIVE REGIONS

FIELD OF THE INVENTION

The present invention relates to a photodiode structure and more particularly pertains to the design of a CMOS-compatible photodiode structure augmented with active area photosensitive regions for detecting impinging radiation at an increased quantum efficiency. The present invention overcomes the problem of poor quantum efficiency intrinsic in prior art photodiode devices formed via deep sub-micron processes and thus offers a small geometry pixel that is comparable to large area pixels that are formed using older processing technologies.

DESCRIPTION OF THE PRIOR ART

There has been a resurgent interest in CMOS image sensors due to demand for miniaturized and cost effective imaging systems. CMOS-based image sensor systems provide an increased opportunity for integrating large amounts of electronics on a chip and reducing associated component and packaging costs. In particular, the key component of the imaging system is the semiconductor photodiode. A variety of CMOS photodiode structures and related fabrication methods are known in the prior art. For example, a typical prior art CMOS photodiode that gives satisfactory performance is denoted by reference numeral 10 and is shown in FIGS. 1–3. Photodiode 10 includes a p/p+ bulk or epitaxial silicon substrate 12 upon which a n+ diffusion layer 14 is arranged in a n-well process. The photodiode is electrically isolated through use of a field oxide 16, thereby exposing an active area 18 upon which radiation such as light may impinge. A polysilicon contact 20 is interconnected with the active area 18 to provide an electrical connection to an unillustrated access transistor in order to implement a CMOS pixel. An isolating dielectric material such as an oxide layer 22 is placed between the polysilicon contact and the active area of the photodiode 10 to prevent transient current flow. The photodiode may be electrically enabled to act as a pixel via a conventional connection method such as passive pixel, photodiode-type active pixel, and photogate-type active pixel.

Regardless of how the device is fabricated and enabled, the basic principle of the photodiode's operation is based on a reverse bias junction capacitance that is subsequently modulated and discharged by impinging light. Once the photodiode is electrically activated, a depletion region 24 is formed at the junction of the layers 12, 14 and acts as a capacitor. When radiation such as light is directed upon the active area 18, photons absorbed in the depletion region of the pre-charged or reversed biased junction generate electron-hole pairs which create a current that discharges the capacitor.

An important characteristic of the photodiode is its quantum efficiency, which is defined as the ratio of the number of photons absorbed in the depletion region 24 to the total number of photons impinging on the photodiode's active area. Because silicon has a very high visible light-absorption coefficient, the depletion region formed underneath the diffusion layer is essentially screened from light by the heavily doped diffusion layer. The photosensitive portions of the device are then concentrated around the periphery of the diffusion layer in localized regions 26 where the depleted silicon is exposed to direct illumination that passes through the overlaying transparent layers of oxide. As such, only a small portion of the device 10 is actually used to generate current at a high quantum efficiency rate.

A further complication arises when CMOS technology is scaled down in deep sub-micron processes. In this case, the device's operating voltages decrease while the required substrate doping levels of its diffusion layer increase. These divergent factors result in a smaller extent of the depletion region underneath the isolating oxide, thereby decreasing the photosensitive portion at the periphery of the depletion region that is available for higher efficiency use.

Several prior art devices have attempted to increase the quantum efficiency of a photodiode, mainly by modifying the impurity profiles of the device itself. For example, U.S. Pat. No. 4,107,722 to Chamberlain discloses a photodiode structure having an enhanced blue color response. In the '722 patent, a photodiode is provided and includes a silicon p substrate, a junction formed by a phosphorous diffusion of low doping density, and a high dose of arsenic or phosphorous ion implantation to provide a shallow implant. In this configuration, a built-in electric field is created within the photodiode that repels the photo-generated minority carriers away from the surface and toward the junction to be collected.

In addition, U.S. Pat. No. 5,430,321 to Effelsberg discloses another photodiode structure that relies upon a tuned diffusion profile scheme to improve quantum efficiency. This photodiode of the '321 patent comprises a semiconductor base layer of p-type conductivity with a high doping density, and epitaxial layer of p-type conductivity with a relatively low doping density, areas of n-type conductivity, and oxide layers covering the areas of n-type conductivity. The oxide layers comprise doping impurities of the same conductivity type as the layers below them. Furthermore, the doping density in the areas of n-type conductivity decrease toward the junction with the epitaxial layer. Due to the decrease in doping density, an electric field gradient is produced which guides the charged carriers to the junction. Thus, the generation of a field gradient and the creation of a surface charge result in an improved quantum efficiency.

Other conventional methods have also been proposed to improve a photodiode's quantum efficiency. For example, the area of the junction (as well as its associated capacitance) could be increased. However, even though the overall saturation charge on the device would increase under this method as desired, two problems are induced. First, this method would result in an unacceptably large chip area for high-resolution CMOS camera applications. Second, if such a photodiode were used in a passive pixel approach, although the overall dynamic range would increase in proportion to the square root of the photodiode's capacitance, the thermal noise generated into the pixel capacitor would also increase, thereby causing a loss of precision at low light levels—a definite disadvantage for camera applications. Another method might be to integrate additional photodiodes with large lateral depletion regions and low doping concentrations. This method, however, requires extra masking and processing operations, making the photodiode more expensive to produce.

SUMMARY OF THE INVENTION

The present invention substantially departs from the described prior art and conventional methods by providing photosensitive regions within the photodiode's active area that increase the volume of the depletion layer available for impinging radiation to strike, thus creating a device with an increased quantum efficiency.

The present invention provides a photodiode junction perforated with a plurality of isolating layers of auxiliary dielectric material. The perimeter portion of the junction is thus substantially increased, thereby having the effect of exposing a larger volume of the unshielded depletion region to impinging light. Thus, the quantum efficiency of the present invention is enhanced as compared to the prior art pixel as depicted in FIG. 1.

The present invention provides a pixel with layers of auxiliary dielectric material within its active area to allow for independent adjustment of pixel quantum efficiency for a given spectral range. For example, the available photosensitive area along the active edge for a given pixel footprint may be individually defined for pixels located under red, green, blue, and related color filters.

The present invention provides a photodiode structure whose quantum efficiency may be modified through the use of separate supplemental isolating patterns such as islands, extensions or comb-type structures islands being preferred.

The present invention provides a photodiode that can be implemented using conventional CMOS processing techniques.

The present invention provides a new and improved photodiode structure augmented with active area photosensitive regions comprising a semiconductor base layer doped with impurities of a first carrier type, a primary dielectric layer disposed upon the base layer and having an opening formed thereon, a plurality of auxiliary dielectric layers wherein each is separately disposed upon the base layer within the opening, and a semiconductor diffusion layer doped with impurities of a second carrier type arranged upon the base layer and in contact with the dielectric layers.

DESCRIPTION OF THE PREFERRED EMBODIMENT

Figure 4:
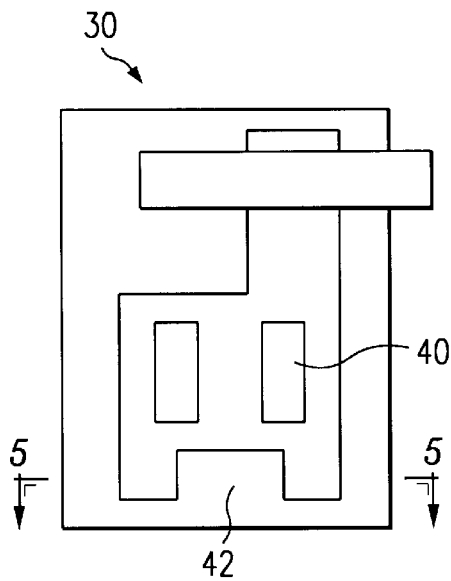
FIG. 4 is a plan view of the preferred embodiment constructed in accordance with the principles of the present invention.
Figure 5:
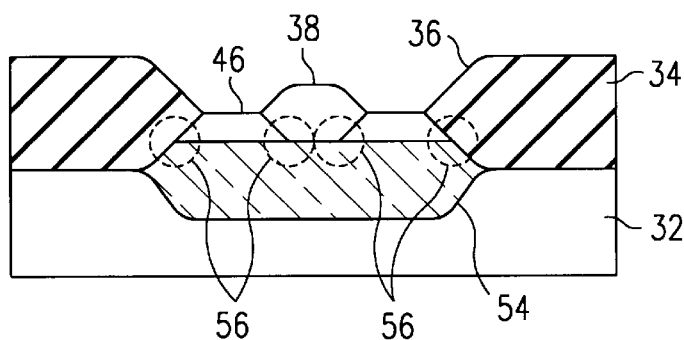
FIG. 5 is a cross-sectional view of the present invention taken along the line 5—5 of FIG. 4.

The photodiode of the present invention is shown broken away in a plan view in FIG. 4 and is designated by reference number 30. Referring to FIG. 5, the present invention includes a semiconductor base layer 32. Preferably, the base layer 32 is formed of bulk or epitaxial silicon and is doped p-type. Alternatively, the base layer may be doped n-type, depending on the type of CMOS application desired. A primary dielectric layer 34 is disposed upon the base layer and covers much of its surface. In the preferred embodiment, layer 34 is formed of undoped silicon dioxide and thus defines a conventional field oxide layer. The field oxide layer has an opening 36 formed thereon that allows exposure of the underlying semiconductor material.

Figure 6:
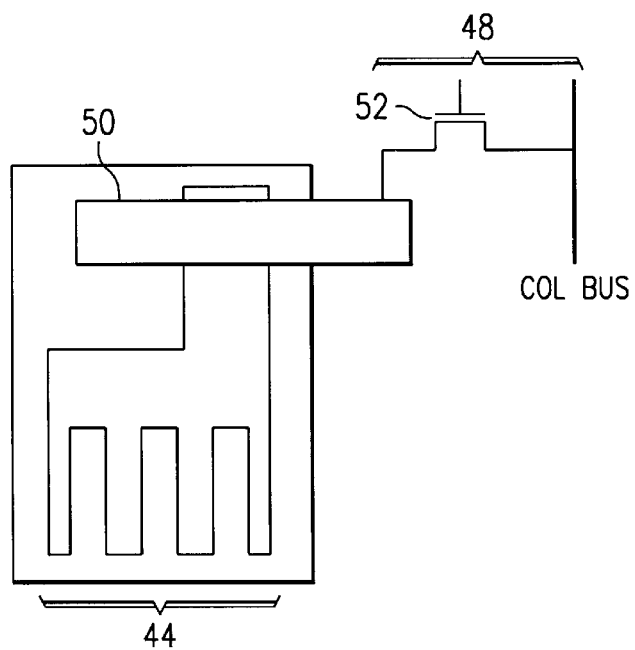
FIG. 6 is a plan view of an alternate embodiment of the present invention.

A plurality of auxiliary dielectric layers 38 are included. Preferably, each auxiliary dielectric layer is formed of undoped silicon dioxide and thus defines an auxiliary oxide layer. Each auxiliary oxide layer is separately disposed upon the base layer within the opening of the field oxide layer to form an isolation region. As shown in FIG. 4, each auxiliary oxide layer can be positioned to create an island 40 or can be elongated in structure with a portion integral with the field oxide layer to create a supplemental extension 42. Alternatively, the auxiliary oxide layers can be arranged within the opening of the field oxide layer to create a comb-type structure 44, as shown in FIG. 6. The use of either the island, extension, or comb-type structure increases the volume of the depletion region available for interaction with light that impinges upon the photodiode.

Figure 1:
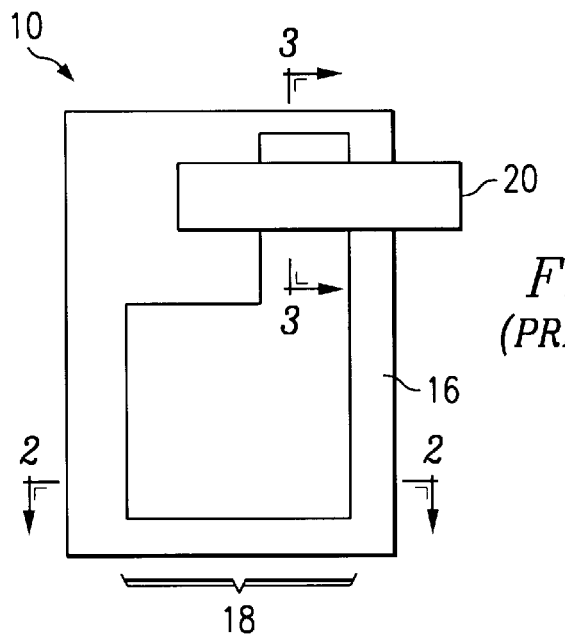
FIG. 1 is a plan view of a prior art photodiode structure.
Figure 2:
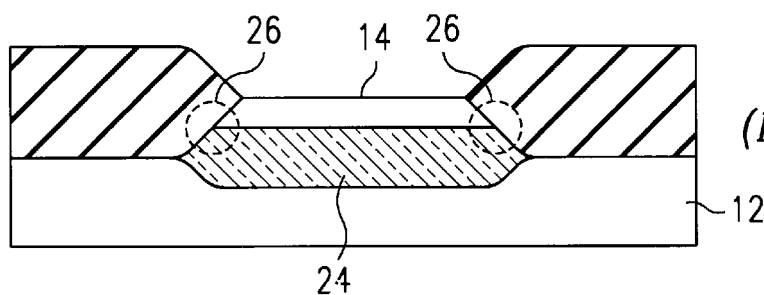
FIG. 2 is a cross-sectional view of the prior art photodiode structure taken along the line 2—2 of FIG. 1.
Figure 3:
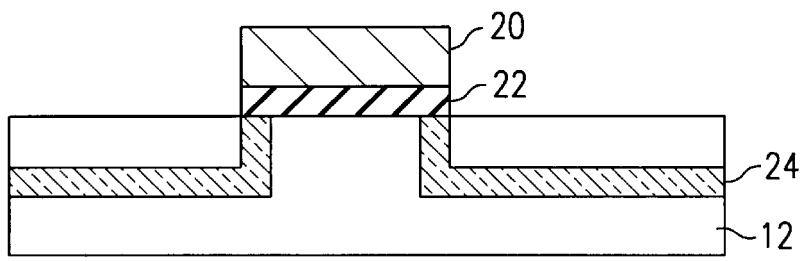
FIG. 3 is a cross-sectional view of the prior art photodiode taken along the line 3—3 of FIG. 1.

Referring again to FIG. 5, a semiconductor diffusion layer 46 is provided and arranged upon the base layer. The diffusion layer is preferably doped with impurities of n-type. The diffusion layer can also be doped p-type if a n-type base layer is selected. The diffusion layer extends laterally such that it is contact with the oxide layers 34, 38. When the device is fabricated using standard techniques, a somewhat angled interface is formed between the diffusion layer and the respective oxide layer. In this configuration, a portion of the diffusion layer extends under a portion of each oxide layer. Although the formation of the interface is, in fact, an artifact of the fabrication process, its creation is desired, because it allows a way for light to directly impinge upon an unshielded depletion region when the light passes through the oxide layer. Note, however, that the present invention would remain operable even without the substantially angled interfaces—light would still be free to impinge upon exposed portions of the depletion region due to interface blur. Lastly, referring to FIG. 6, the present invention includes a circuit 48 for delivering electrical energy to the photodiode to enable its operation as a pixel. An electrical connection is formed via an interconnecting polysilicon contact 50 and supplemental isolating oxide 22 as previously shown in FIG. 3. As illustrated here, the present invention is being used in a conventional passive pixel approach.

When the transfer gate transistor 52 is pulsed, any photo-generated charge that is integrated on the photodiode is shared on the column bus capacitance. Referring to FIG. 5, a depletion region 54 is created upon the electrical activation of the photodiode and includes a plurality of photosensitive regions 56 that are located adjacent to the oxide layers 34, 38. Light impinging on the device 30 may travel directly through the oxide layers to the depletion region in order to generate electron-hole pairs. Consequently, the device is more sensitive to impinging radiation in regions 56 than it is at locations directly under the diffusion layer 46. Through the addition of the isolating auxiliary oxide layers, the volume of the depletion region available for receiving impinging light is increased, thereby enhancing the present invention's quantum efficiency.

The present invention may be implemented using conventional CMOS fabrication techniques. High energy implants into the diffusion layer 46 are chosen so as to achieve maximum well doping just underneath the large isolating oxide areas 34, 38. In addition, since oxide growth is retarded in narrow openings, the present invention will be fabricated with reduced well doping levels under the proposed isolation regions. This approach will, in turn, increase the extent of the lateral depletion region located around the heavily doped diffusion layer, increase the depletion region volume exposed to light, and thus further enhance the pixel's quantum efficiency. Reduction of the effective doping levels under the isolation regions will also reduce the peripheral component of the junction leakage current.

What is claimed is:

1. A photodiode structure comprising:
   a semiconductor base layer doped with impurities of a first carrier type;
   a primary dielectric layer disposed upon the base layer and having an opening formed therethrough;
   a plurality of auxiliary dielectric layers wherein each is separately disposed upon the base layer within the opening and wherein at least some of which are separated from the primary dielectric layer to define islands within the opening; and
   a semiconductor diffusion layer doped with impurities of a second carrier type arranged upon the base layer and in contact with the dielectric layers in the opening.

2. A photodiode structure comprising:
   a semiconductor base layer doped with impurities of a first carrier type;
   a field oxide layer disposed upon the base layer and having an opening formed therethrough;
   a plurality of auxiliary oxide layers wherein each is separately disposed upon the base layer within the opening of the field oxide layer and wherein at least some of which are separated from the field oxide layer to define islands within the opening; and
   a semiconductor diffusion layer doped with impurities of a second carrier type arranged upon the base layer and in contact with the oxide layers in the opening.

3. The photodiode structure of claim 1 wherein the semiconductor is bulk silicon.

4. The photodiode structure of claim 1 wherein the semiconductor is epitaxial silicon.

5. The photodiode structure of claim 1 wherein the base layer is p-type and the diffusion layer is n-type.

6. The photodiode structure of claim 1 wherein the base layer is n-type and the diffusion layer is p-type.

7. The photodiode structure of claim 1 wherein each island is contacted around its entire periphery by the semiconductor diffusion layer within the opening.

8. The photodiode structure of claim 1 wherein the auxiliary dielectric layers are each thinner than the primary dielectric layer.

9. The photodiode structure of claim 1 wherein the auxiliary dielectric layers have angled edges defining photosensitive regions thereunder.

10. The photodiode structure of claim 1 wherein a portion of the diffusion layer extends under a portion of each dielectric layer.

11. The photodiode structure as set forth in claim 1 and further comprising means for delivering electrical energy to the photodiode to thereby create a depletion region with a plurality of integral photosensitive regions that are located adjacent to the dielectric layers.

12. The photodiode structure of claim 2 wherein the semiconductor is bulk silicon.

13. The photodiode structure of claim 2 wherein the semiconductor is epitaxial silicon.

14. The photodiode structure of claim 2 wherein the base layer is p-type and the diffusion layer is n-type.

15. The photodiode structure of claim 2 wherein the base layer is n-type and the diffusion layer is p-type.

16. The photodiode structure of claim 2 wherein each island is contacted around its entire periphery by the semiconductor diffusion layer within the opening.

17. The photodiode structure of claim 2 wherein the auxiliary oxide layers are each thinner than the field oxide layer.

18. The photodiode structure of claim 2 wherein the auxiliary oxide layers have angled edges defining photosensitive regions thereunder.

19. The photodiode structure of claim 2 wherein a portion of the diffusion layer extends under a portion of each oxide layer.

20. A photodiode structure comprising:
   a silicon base layer doped with impurities of a first carrier type;
   a field oxide layer disposed upon the base layer and having an opening formed therethrough;
   a plurality of auxiliary oxide layers wherein each is separately disposed upon the base layer within the opening of the field oxide layer and wherein at least some of which are separated from the field oxide layer to define islands within the opening;
   a silicon diffusion layer doped with impurities of a second carrier type arranged upon the base layer and in contact with the oxide layers; and
   means for delivering electrical energy to the photodiode to thereby create a depletion region with a plurality of integral photosensitive regions that are located adjacent to the oxide layers.

\* \* \* \* \*